United States Patent
Seol (10) Patent No.: US 8,686,491 B2
(45) Date of Patent: *Apr. 1, 2014

(54) MEMORY DEVICES CAPABLE OF REDUCING LATERAL MOVEMENT OF CHARGES

(71) Applicant: Samsung Electronics Co., Ltd., Suwon-si (KR)

(72) Inventor: Kwang-Soo Seol, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/705,595

(22) Filed: Dec. 5, 2012

(65) Prior Publication Data

US 2013/0092998 A1    Apr. 18, 2013

Related U.S. Application Data

(63) Continuation of application No. 12/461,612, filed on Aug. 18, 2009, now Pat. No. 8,350,315.

(30) Foreign Application Priority Data

Aug. 19, 2008    (KR) .................. 10-2008-0081072

(51) Int. Cl.
*H01L 29/788* (2006.01)
*H01L 29/792* (2006.01)

(52) U.S. Cl.
USPC ........... 257/326; 257/314; 257/315; 257/316; 257/317; 257/E29.309

(58) Field of Classification Search
USPC ....... 257/314–317, 324, 326, E29.3, E29.309
See application file for complete search history.

(56) References Cited

U.S. PATENT DOCUMENTS

| | | | |
|---|---|---|---|
| 5,434,813 | A | 7/1995 | Tamura et al. |
| 6,136,653 | A | 10/2000 | Sung et al. |
| 6,806,517 | B2 | 10/2004 | Kim et al. |
| 2006/0057805 | A1 | 3/2006 | Lee |
| 2006/0131633 | A1 | 6/2006 | Bhattacharyya |

FOREIGN PATENT DOCUMENTS

| | | |
|---|---|---|
| KR | 10-0594307 | 6/2006 |
| KR | 10-0673225 | 1/2007 |
| KR | 10-2008-0001352 | 1/2008 |

*Primary Examiner* — Allison P Bernstein
(74) *Attorney, Agent, or Firm* — Harness, Dickey & Pierce, P.L.C.

(57) ABSTRACT

The memory devices include a tunneling insulating layer disposed on a substrate, a charge storage layer disposed on the tunneling insulating layer, a blocking insulating layer disposed on the charge storage layer and a control gate electrode disposed on the blocking insulating layer. The control gate electrode may have an edge portion spaced farther apart from the blocking insulating layer than a central portion of the control gate electrode to concentrate charge density distribution on a central portion of a memory cell.

10 Claims, 7 Drawing Sheets

MEMORY DEVICES CAPABLE OF REDUCING LATERAL MOVEMENT OF CHARGES

CROSS-REFERENCE TO RELATED APPLICATIONS

This application is a continuation application of U.S. application Ser. No. 12/461,612, filed on Aug. 18, 2009, now allowed, which claims the benefit of priority from Korean Patent Application No. 10-2008-0081072, filed on Aug. 19, 2008, in the Korean Intellectual Property Office, the entire contents of each of which is incorporated herein by reference.

BACKGROUND

1. Field

Example embodiments relate to memory devices. Other example embodiments relate to memory devices capable of reducing lateral movement of charges.

2. Description of the Related Art

Among semiconductor memory devices, nonvolatile memory devices retain stored data even if a power supply is interrupted. A floating-gate flash memory, which operates using charges stored in a floating gate formed of polysilicon (poly-Si), is commercially available as a high-capacity nonvolatile memory.

Memory cells of the flash memory may be divided into a single-level cell (SLC) in which two write states (1 and 0) are written and a multi-level cell (MLC) in which at least four write states (e.g., 11, 01, 00, and 10) are written. MLC technology may be necessary for high-capacity NAND-type flash memories and NOR-type flash memories.

In an MLC operation mode, the distribution of threshold voltages $V_{th}$ of memory cells corresponding to respective write states should be low in order to separately recognize the respective write states.

In a floating-gate flash memory, as a cell size decreases, controlling the distribution of threshold voltages becomes more difficult due to an increase in coupling between cells (particularly, coupling between floating gates).

In recent years, in order to reduce coupling between cells, a charge trap flash (CTF) memory has been researched wherein an insulating layer, that has a charge trap site (e.g., a silicon nitride ($Si_3N_4$) charge trap site) capable of trapping charges instead of a floating gate, is used as a charge storage layer (i.e., a charge trap layer).

In the CTF memory, if an electrostatic force between charges stored in adjacent cells is increased, the trapped charges may tunnel, or hop, between trap sites present in the insulating layer because charges are trapped in the insulating layer (e.g., the $Si_3N_4$ having a charge trap site).

In order to program the CTF memory, a voltage of 0V is applied to an active region corresponding to a selected bit line, a power supply voltage $V_{cc}$ is applied to an unselected bit line, a program voltage $V_{pgm}$ is applied to a selected word line and a pass voltage $V_{pass}$ is applied to an unselected word line. Due to the program operation, electrons are injected through a tunneling oxide layer only to cells where the selected bit line overlaps the selected word line. The injected electrons are trapped and stored in trap sites scattered in the charge trap layer.

During a program operation of an MLC, the program operation may be repeated by boosting program voltage $V_{pgm}$ to a specific level by stages in order to reduce the distribution of threshold voltages $V_{th}$ of program cells corresponding to respective levels. This is called an incremental step pulse program (ISPP) method.

If stored data is erased from the CTF memory, an erase voltage $V_{ERS}$ is applied to a bulk portion and a voltage of 0V is applied to control gates of all word lines so that all memory cells (i.e., a memory block) connected by the bulk portion may be erased at one time. In this case, a block of a memory device is formed of a plurality of pages. For example, if a plurality of memory cells connected in series to a single bit line constitute a single string in a NAND-type flash memory, the pages may be classified on the basis of memory cells connected to a single word line. A read operation and a program operation may be performed in page units, and an erase operation may be performed in block units.

During the erase operation, holes may be injected from the active region through the tunneling oxide layer to the charge trap layer and neutralize the electrons stored in the memory cell during the program operation.

Because all cells included in a single block are erased at the same time, the distribution of threshold voltages $V_{th}$ of the erased cells may not be controlled, and thus have a high value unlike in the program operation. Considering this characteristic, the erase operation may be performed so as to sufficiently erase all the memory cells. As such, the distribution of the threshold voltages $V_{th}$ of the erased cells may have a negative value within a range of 0 to −3V.

Because a programmed memory cell has a positive threshold voltage $V_{th}$, there is a big charge potential difference between the programmed cell and the erased cell. Due to the potential difference, the charges stored in the charge trap layer may move toward the word line.

If the stored charges gradually move toward the word line after the program operation, the threshold voltage $V_{th}$ of the programmed memory cell gradually decreases so that stored data may be lost. The movement of the charges stored in the charge trap layer towards the word line may degrade the reliability of the CTF memory.

SUMMARY

Example embodiments relate to memory devices. Other example embodiments relate to memory devices capable of reducing lateral movement of charges.

Example embodiments relate to a memory device capable of reducing lateral movement of charges to ensure reliability during long-term data retention.

According to example embodiments, there is provided a memory device including a substrate, a tunneling insulating layer disposed on the substrate and a charge storage layer disposed on the tunneling insulating layer. A blocking insulating layer may be disposed on the charge storage layer. A control gate electrode may be disposed on the blocking insulating layer. The control gate electrode may have an edge portion spaced farther apart from the blocking insulating layer than a central portion of the control gate electrode to concentrate charge density distribution on a central portion of a memory cell.

The control gate electrode may have an inverted mesa structure wherein an edge portion is spaced farther apart from the blocking insulating layer than a central portion thereof.

The central portion of the control gate electrode may have a plane surface disposed opposite the blocking insulating layer. The edge portion of the control gate electrode may have an inclined surface that inclines towards the blocking insulating layer.

The edge portion of the control gate electrode may have a thickness equal to, or smaller than, that of the central portion thereof and taper outward.

The control gate electrode may have an inverted trapezoidal structure, or an inverted mesa structure, wherein a surface facing the blocking insulating layer is narrower than an opposite surface thereof.

A surface of the control gate electrode, which faces the blocking insulating layer, may have a central portion with a pointed inverted triangular sectional structure.

A surface of the control gate electrode, which faces the blocking insulating layer, may have a convex surface that curves towards the blocking insulating layer.

The central portion of the control gate electrode may have a plane surface disposed opposite the blocking insulating layer, and the edge portion of the control gate electrode may have a concave surface that tapers outward and away from the blocking insulating layer.

The memory device may include a bottom spacer interposed between the control gate electrodes to fill a region between the edge portion of the control gate electrode and the blocking insulating layer.

The bottom spacer may be formed of an insulating material. A gate dielectric material, which is disposed in the central portion of the memory cell corresponding to the central portion of the control gate electrode, may be thinner than that disposed in an edge portion of the memory cell corresponding to the edge portion of the control gate electrode.

The charge storage layer may be a charge trap layer.

According to example embodiments, the control gate electrode may have at least two edge portions spaced farther apart from the blocking insulating layer than a central portion of the control gate electrode. The edge portions may be on opposing sides of the control gate electrode and facing the blocking insulating layer.

Each of the edge portions may be between a sidewall of the control gate electrode and a surface of the control gate electrode nearest to the blocking insulating layer. The central portion of the control gate electrode may be positioned between the edge portions of the control gate electrode.

In the memory device according to example embodiments, lateral movement of charges due to electrostatic attraction between charges stored in a memory cell and charges stored in an adjacent memory cell may be inhibited. As such, even if data is retained for a long time, degradation of reliability may be substantially reduced.

BRIEF DESCRIPTION OF THE DRAWINGS

Example embodiments will be more clearly understood from the following detailed description taken in conjunction with the accompanying drawings. FIGS. 1-14 represent non-limiting, example embodiments as described herein.

DETAILED DESCRIPTION OF EXAMPLE EMBODIMENTS

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to memory devices. Other example embodiments relate to memory devices capable of reducing lateral movement of charges.

If a charge trap layer is formed of silicon nitride, the mobility of charges varies nonlinearly according to the intensity of an electric field applied to the charge trap layer. As such, as the electric field increases, the acceleration of the mobility of charges increases.

Figure 1:
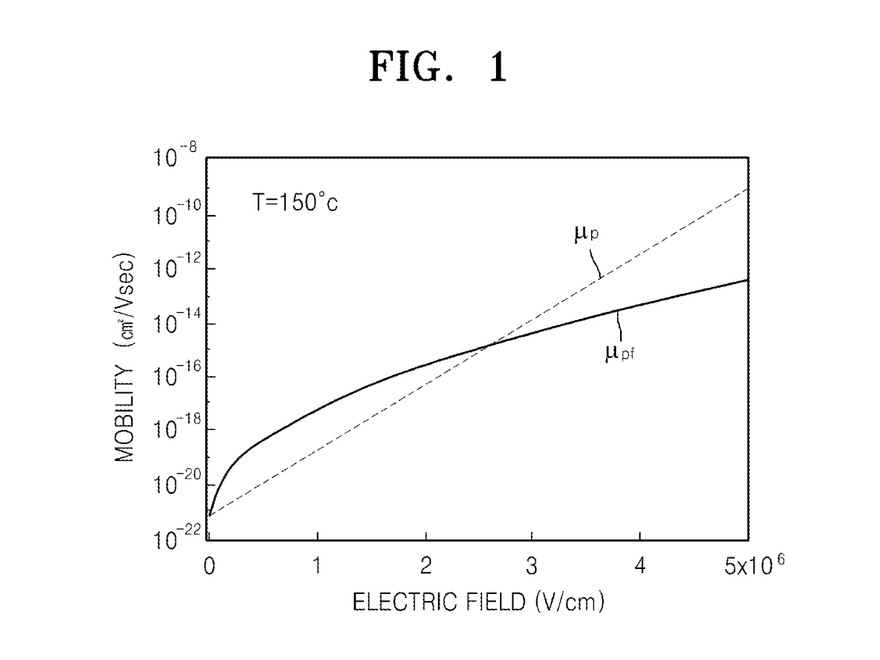
FIG. 1 is a graph of a calculated mobility of electrons relative to an applied electric field.

FIG. 1 is a graph of a calculated mobility of electrons relative to applied electric field.

FIG. 1 shows change in the mobility of electrons relative to electric field at a temperature of about 150° C. In FIG. 1, $\mu_p$ denotes a mobility calculated based on a Poole model, and $\mu_{pf}$ denotes a mobility calculated based on a Poole-Frenkel model. As observed in FIG. 1, as an electric field increases from 1-MV/cm to 2-MV/cm, the mobility of electrons may increase by a factor of 100.

Figure 2:
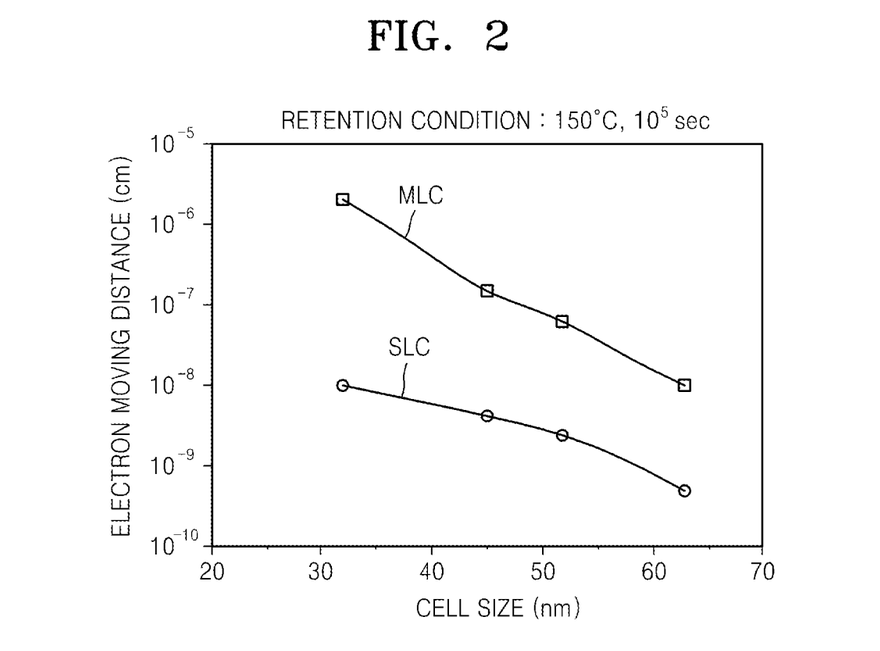
FIG. 2 is a graph of a calculated motion distance of electrons relative to an interval between two adjacent memory cells in each of program and erase states.

FIG. 2 is a graph of a calculated motion distance of electrons relative to an interval between two adjacent memory cells in each of program and erase states.

FIG. 2 shows a motion distance of electrons calculated considering the electron mobility of a silicon nitride trap layer that is retained at a temperature of about 150° C. for 105 seconds.

In the case of a single-level cell (SLC) memory, a typical memory cell may be switched between a program state (or "0" state) and an erase state (or "1" state). Also, a threshold voltage corresponding to the program state (or "0" state) may range from, for example, about 1-V to 3-V, and a threshold voltage corresponding to the erase state (or "1" state) may range from, for example, −0.5-V to −2.0-V.

The highest electric field caused between adjacent cells may be calculated using a function of a potential difference between the highest program threshold voltage (3-V) in the program state and the lowest threshold voltage (−2.0-V) in the erase state and a distance between the adjacent cells.

In the case of an SLC memory with an inter-cell distance of 32-nm, if a programmed memory cell has the highest threshold voltage and its adjacent erased memory cell has the lowest threshold voltage, a lateral electric field of about 1-MV/cm may be generated. If the SLC memory is retained at a temperature of about 150° C. for about 105 seconds, charges move only a short distance of about 0.2-nm. As such, even if data is retained for a long time, lateral movement of electrons hardly occurs so that the data maintains its initial input state.

In a multi-level cell (MLC) memory (e.g., a 4-level memory), a typical memory cell may be in a program state (i.e., "00" state, "01" state, or "10" state) or an erase state (i.e., "11" state). Because the program state is divided into three states, the highest program threshold voltage may be, for example, about 4.5-V. An erase threshold voltage may range from, for example, −2-V to −4-V. In this case of an MLC memory with an inter-cell distance is 32 nm, if a programmed memory cell has the highest threshold voltage and its adjacent erased memory cell has the lowest threshold voltage, a lateral electric field of about 2-MV/cm may be generated. If the MLC memory is retained at a temperature of about 150° C. for about 105 seconds, electrons trapped in the programmed cell move a long distance of about 20-nm. As such, if data is retained for a long time, most of the electrons stored in the programmed cell move to its adjacent cell so that the data cannot maintain its initial input state.

A 64-Gbit NAND flash memory approximates a cell size of about 30-nm. In order to realize a 64-Gbit or higher high-capacity charge trap flash (CTF) memory, it may be necessary to increase a data retention characteristic by preventing (or reducing) lateral movement of charges.

By use of a memory device according to example embodiments described hereinafter, lateral movement of charges may be prevented (or reduced) even in a 64-Gbit or higher high-capacity CTF memory in order to increase its data retention characteristic.

The memory device described herein is fabricated such that a charge density distribution in a charge storage layer does not sharply vary at a boundary of a memory cell to reduce lateral movement of charges.

Lateral movement of charges according to a charge density distribution will now be described in detail with reference to the accompanying equations.

Figure 3:
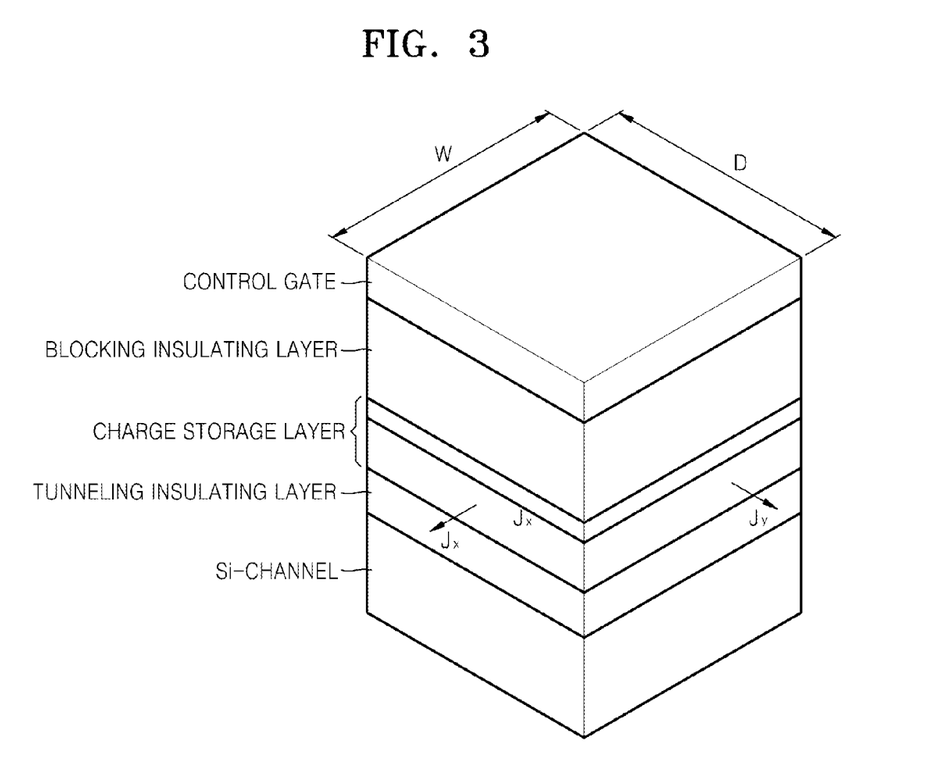
FIG. 3 is a perspective view of a charge-trap-type flash memory cell, which shows flux densities $J_x$ and $J_y$ of lateral movement of charges due to fields inside and outside the cell.

FIG. 3 is a perspective view of a CTF memory cell, which shows flux densities $J_x$ and $J_y$ of lateral movement of charges due to fields inside and outside the cell.

Referring to FIG. 3, if lateral movement of charges occurs due to an electric field generated inside and outside the memory cell, a program state (i.e., a variation in threshold voltage) of the memory cell due to the lateral movement of the charges (particularly, emission of charges from the memory cell) may be expressed as shown in Equation (1):

$$\Delta V_{th}(t = t_{hts}) =$$

$$\int \frac{dQ}{C(z')} = \int \frac{\int\int \Delta\rho(x', y', z')dx'dy'}{\varepsilon WL}(c - z')dz'$$

EQUATION (1)

wherein $\Delta V_{th}$ ($t=t_{hts}$) denotes a variation in a program voltage $V_{th}$ caused if the memory cell is retained for a set time $t_{hts}$ and a charge density distribution function $\rho(x', y', z')$ is varied due to the lateral movement of charges. W, L, and "c" denote the width and length of the memory cell and the thickness of a gate dielectric layer, respectively. The thickness "c" of the gate dielectric layer corresponds to the sum of thicknesses of a tunneling insulating layer, a charge trap layer (a charge storage layer) and a blocking insulating layer.

The variation in the charge density distribution function may be expressed as shown in Equation (2):

$$\Delta\rho(x',y',z') = \int \nabla(\rho(x',y',z')\mu E(x',y',z'))dt$$

EQUATION (2)

wherein μ and E denote the mobility and electric field of charges at a position (x', y', z').

Equation (2) is obtained using the following Equation (3) (a continuous equation) of the charge density distribution function ρ and the mobile flux density J of charges and Equation (4) derived from an electrical conduction equation (J=σE).

$$-\frac{\partial \rho(x', y', z')}{\partial t} = \nabla J(x', y', z')$$

EQUATION (3)

$$\nabla J(x', y', z') = \nabla [\sigma E(x', y', z')] = \nabla [\rho \mu E(x', y', z')]$$

EQUATION (4)

If Equation (4) is rearranged using Equation 5 of charge mobility of a charge trap layer, Equation 6 can be obtained.

$$\mu = \mu_o \exp\left(-\left(\phi - \frac{\beta}{kT}E\right)\right)$$

EQUATION (5)

$$= \mu E\left(\frac{\partial \rho}{\partial x'} + \frac{\partial \rho}{\partial y'} + \frac{\partial \rho}{\partial z'}\right) +$$

$$\rho E\left(\frac{\partial \mu}{\partial x'} + \frac{\partial \mu}{\partial y'} + \frac{\partial \mu}{\partial z'}\right) + \rho\mu\left(\frac{\partial E}{\partial x'} + \frac{\partial E}{\partial y'} + \frac{\partial E}{\partial z'}\right) =$$

$$\mu E\left(\frac{\partial \rho}{\partial x'} + \frac{\partial \rho}{\partial y'} + \frac{\partial \rho}{\partial z'}\right) + \frac{\beta}{kT}\mu E\rho\left(\frac{\partial E}{\partial x'} + \frac{\partial E}{\partial y'} + \frac{\partial E}{\partial z'}\right)$$

EQAUTION (6)

From Equation (6), it can be seen that charge mobility (i.e., flux density) increases in proportion to the electric field (hereinafter "an E field") and mobility μ of charges at each position (x', y', z') in a memory cell.

For quantitative analysis of the relationship, a variation in the E field was calculated assuming the distribution of charges at an arbitrary position in a memory cell.

Figure 4A:
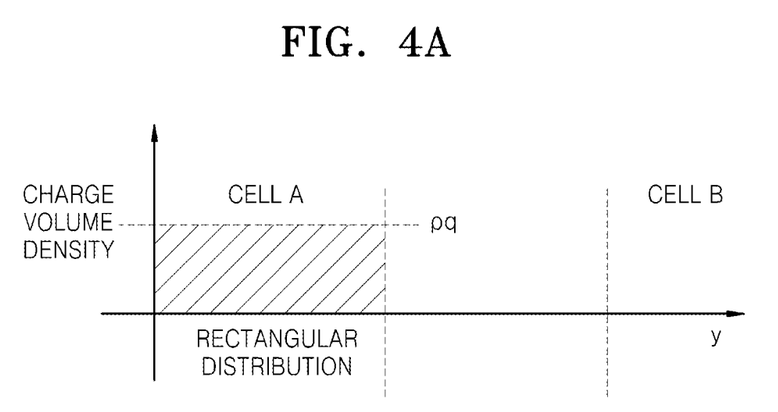
FIG. 4A is a graph of a charge density function with a stepwise distribution according to a position "y" in a memory cell.
Figure 4B:
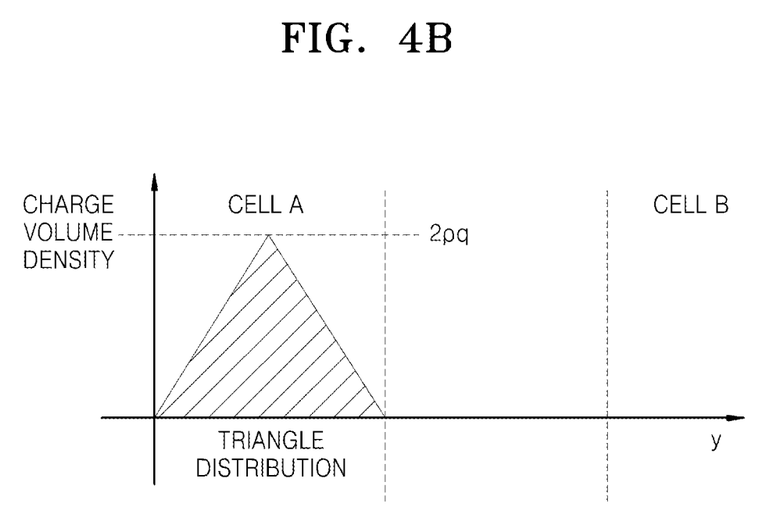
FIG. 4B is a graph of a charge density function with a triangular distribution according to a position "y" in a memory cell.

FIG. 4A is a graph of a charge density function with a stepwise distribution according to a position "y" in a memory cell. FIG. 4B is a graph of a charge density function with a triangular distribution according to a position "y" in a memory cell.

Referring to FIGS. 4A and 4B, an abscissa denotes the position "y" in the memory cell, and an ordinate denotes charge volume density relative to the position "y". FIGS. 4A and 4B illustrate a case where a memory cell A is charged and has a charge density and a memory cell B adjacent to the memory cell A is not charged and has no charge density.

Figure 5:
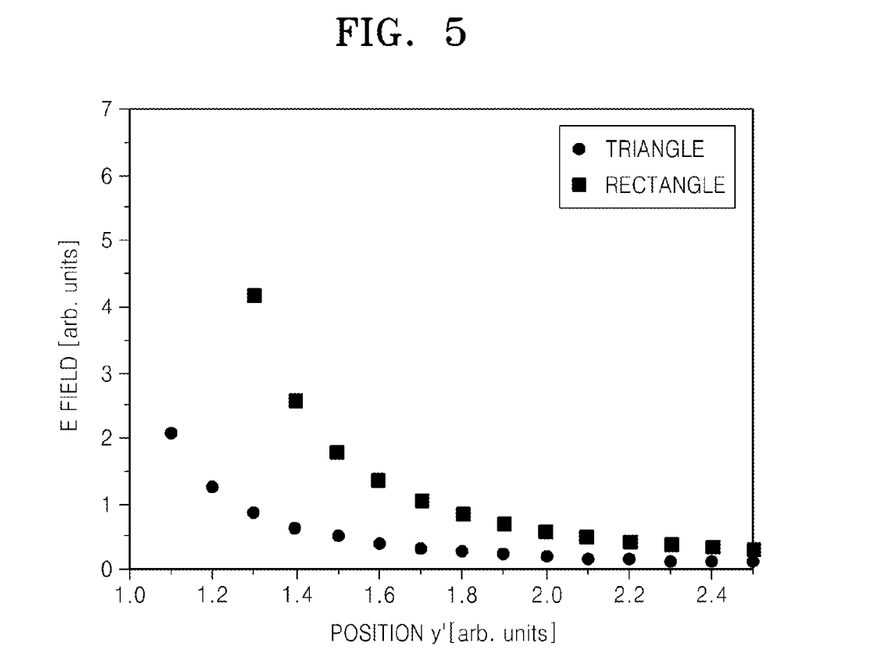
FIG. 5 is a graph of an E field relative to a position "y'" in each of stepwise and triangular charge density functions.

FIG. 5 is a graph of an E field relative to a position "y'" in each of stepwise and triangular charge density functions.

In FIG. 5, a boundary of memory cell may be expressed using y'=1.

Referring to FIG. 5, in comparison to the charge density having the stepwise distribution (rectangular distribution) shown in FIG. 4A, if the charge density has a triangle distribution shown in FIG. 4B, a lower E field is generated at the boundary of the memory cell and adjacent memory cells are less influenced.

If the charge density distribution substantially varies at the boundary between the memory cells as the stepwise distribution (rectangular distribution) shown in FIG. 4A, accumulated charges are quickly emitted from the memory cell due to an internal E field. Based on Equation (6), it can be predicted that if the charge density substantially varies according to the position "y", a variation rate increases.

Referring to FIG. 5 and Equation 6, in comparison to the density of charges stored in the memory cell substantially varying as stepwise distribution, if the charge density distribution slightly varies as a triangular shape and concentrates on the center, lateral movement of charges may be reduced more effectively.

Considering the above results, a memory device according to example embodiments relate to a gate structure that allows charges injected in a CTF memory cell during a program, or erase, operation to have a slight density distribution at a boundary of memory cell during program or erase operation.

Figure 6:
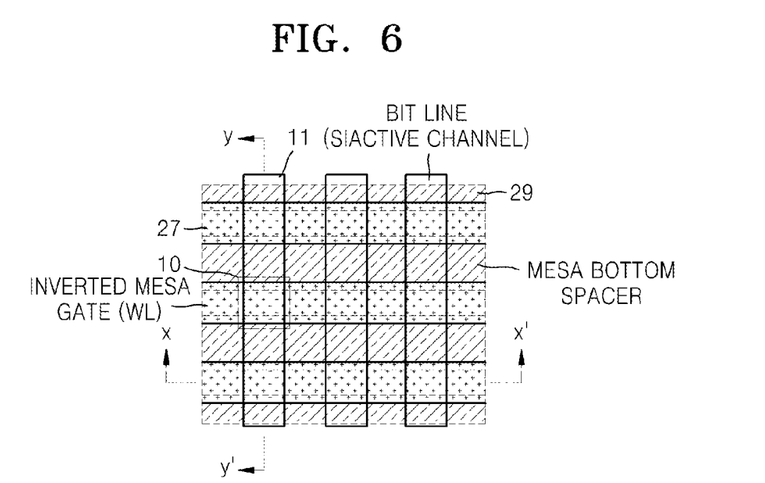
FIG. 6 is a plan view of a memory device according to example embodiments.
Figure 7:
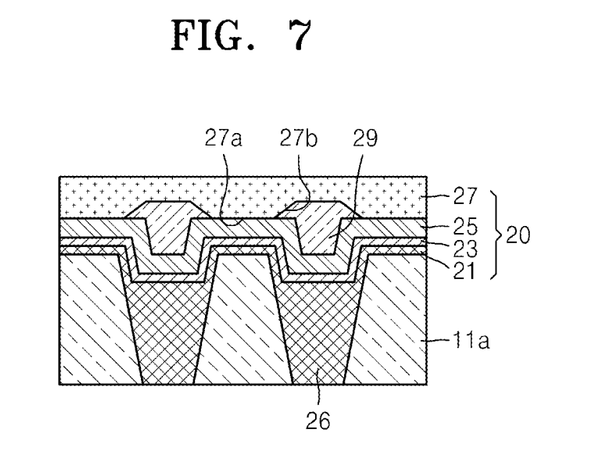
FIG. 7 is a cross-sectional view taken along a line x-x', which corresponds to a word line of the memory device shown in FIG. 6.
Figure 8:
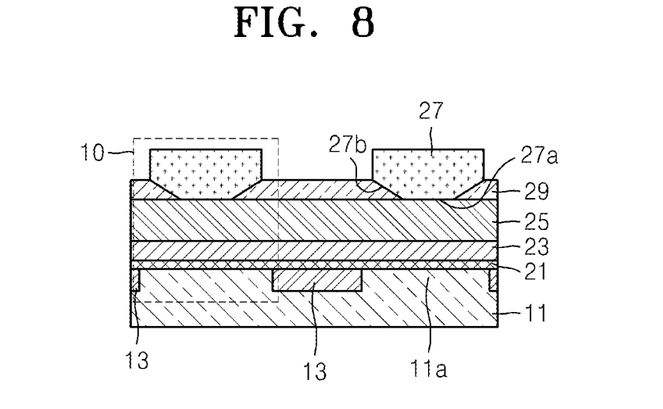
FIG. 8 is a cross-sectional view taken along a line y-y', which corresponds to a bit line of the memory device shown in FIG. 6.

FIG. 6 is a plan view of a memory device according to example embodiments. FIG. 7 is a cross-sectional view taken along a line x-x', which corresponds to a word line of the memory device shown in FIG. 6. FIG. 8 is a cross-sectional view taken along a line y-y', which corresponds to a bit line of the memory device shown in FIG. 6.

Although FIGS. 6, 7 and 8 show a NAND-type memory device according to example embodiments, example embodiments are not limited thereto. For example, example embodiments may be applied to a NOR-type memory device.

Referring to FIGS. 6, 7 and 8, the memory device according to example embodiments, which has an inverted mesa gate structure, includes a substrate 11 having a channel region 11a and a gate structure 20 disposed on the substrate 11. The gate structure 20 allows charges injected during a program, or erase, operation to show a gentler (or not a sharp variation of the) density distribution at a boundary of memory cell.

The substrate 11 may be a silicon (Si) semiconductor substrate or a substrate obtained by forming a single crystalline Si layer on a silicon-on-insulator (SOI) substrate. The channel region 11a may correspond to a Si active channel.

If the memory device according to example embodiments is a flash memory device that is erased in block units, the substrate 11 may include, for example, a p-well (not shown) doped with p-type impurities. The channel region 11a may be disposed in the p-well. If the substrate 11 has the p-well, a portion of the substrate 11 shown in FIGS. 7 and 8 may correspond to the p-well. An impurity region 13 doped with set (or desired) conductive impurities may be formed between the channel regions 11a. The impurity region 13 may be formed in the p-well. Impurity regions 13 may be disposed on both sides of a single channel region. One of the impurity regions 13 may function as a drain region D, and the other impurity region 13 may function as a source region S.

The channel region 11a may be defined by a device isolation region 26, a control gate electrode 27 of the gate structure 20, and the impurity region 13. The device isolation region 26 may be formed using a shallow trench isolation (STI) process to electrically insulate the memory cells from one another. The control gate electrode 27 of the gate structure 20 may constitute a word line. The channel region 11a may constitute a bit line.

If the memory device according to example embodiments is a NAND-type memory device, the bit line including the channel region 11a may intersect the word line including the control gate electrode 27 as shown in FIG. 6. A region where the bit line intersects the word line corresponds to a memory cell 10. In the NAND-type memory device, memory cells 10 disposed at intersections between bit lines and word lines are arranged two dimensionally.

The gate structure 20 may include a tunneling insulating layer 21 disposed on the substrate 11, a charge storage layer 23 disposed on the tunneling insulating layer 21, a blocking insulating layer 25 disposed on the charge storage layer 23 and the control gate electrode 27 disposed on the blocking insulating layer 25. An edge portion of the control gate electrode 27 may be spaced farther apart from the blocking insulating layer 25 than a central portion of the control gate electrode 27 such that more charges concentrate on a central portion of the memory cell and the charge density distribution slightly varies at the boundary of the memory cell.

The tunneling insulating layer 21 may be required for tunneling of charges. The tunneling insulating layer 21 may be formed on the substrate 11. The impurity region 13 may be formed on the substrate 11, for example, in the p-well of the substrate 11. The impurity region 13 may be electrically connected to the tunneling insulating layer 21. The tunneling insulating layer 21 may be a tunneling oxide layer formed of, for example, $SiO_2$, various high-k oxides or a combination thereof.

The tunneling insulating layer 21 may be a silicon nitride layer (e.g., $Si_3N_4$). The silicon nitride layer may have a low impurity concentration (i.e., as lightly doped as a silicon oxide layer) and/or increased interface characteristics with silicon (Si).

The tunneling insulating layer 21 may have multiple layers of a silicon nitride layer and an oxide layer.

As described above, the tunneling insulating layer 21 may be a single layer of an oxide layer or a nitride layer, or a multiple layer formed of materials with different energy gaps.

The charge storage layer 23 may store data due to accumulation of charges. The charge storage layer 23 may be a charge trap layer. The memory device according to example embodiments may correspond to a CTF memory device.

In order to function as a charge trap layer, the charge storage layer 23 may be formed of one selected from the group consisting of a nitride, a high-k dielectric material, nanodots and combinations thereof. For example, the charge storage layer 23 may be formed of a nitride (e.g., $Si_3N_4$) or a high-k oxide (e.g., $HfO_2$, $ZrO_2$, $Al_2O_3$, HfSiON, HfON, HfAlO or combinations thereof). The charge storage layer 23 may be a charge trap site containing a plurality of nanodots arranged discontinuously. The nanodots may include nanocrystals. If the charge storage layer 23 functions as a charge trap layer as described above, the memory cell 10 may be a CTF memory cell.

The blocking insulating layer 25 may be used to prevent (or reduce the likelihood of) charges from moving upward through the charge storage layer 23. The blocking insulating layer 25 may be an oxide layer.

The blocking insulating layer 25 may be formed of $SiO_2$ or a high-k material having a higher dielectric constant than the tunneling insulating layer 21 (e.g., $Si_3N_4$, $Al_2O_3$, $HfO_2$, $Ta_2O_5$, $ZrO_2$ or combinations thereof). The blocking insulating layer 25 may be a multilayered structure. For example, the blocking insulating layer 25 may include at least two layers including an insulating layer formed of a common insulating material (e.g., $SiO_2$) and a high-k material layer formed of a material with a higher dielectric constant than the tunneling insulating layer 21.

The control gate electrode 27 may be formed using a metal layer. For example, the control gate electrode 27 may be formed of TaN, aluminum (Al), ruthenium (Ru) or a silicide material (e.g., NiSi).

Referring to FIGS. 7 and 8, the control gate electrode 27 may be formed such that charges are concentrated on the central portion of the memory cell 10 and the charge density distribution shows a slight (or substantially small) variation at the boundary of the memory cell 10.

For example, the control gate electrode 27 may have an inverted mesa gate structure in which an edge portion 27b is spaced farther from the blocking insulating layer 25 than a central portion 27a. The central portion 27a of the control gate electrode 27 may have a plane surface disposed opposite to the blocking insulating layer 25. The edge portion 27b may have an inclined surface that inclines towards the blocking insulating layer 25.

The control gate electrode 27 may have an inverted mesa structure wherein a surface facing the blocking insulating layer 25 is narrower than an opposite surface thereof, or an inverted trapezoidal structure described later.

The edge portion 27b of the control gate electrode 27 may have a thickness equal to, or smaller than, that of the central portion 27a thereof. The edge portion 27b may taper outward so that its position facing the blocking insulating layer 25 may slightly vary in a height (or vertical) direction.

The edge portion 27b of the control gate electrode 27 may correspond to an edge portion of a bottom surface of the control gate electrode 27 in a y-y' direction parallel to the bit line. The edge portion 27b may be farther away from the blocking insulating layer 25 towards a sidewall of the device. The bottom surface of the control gate electrode 27 faces the blocking insulating layer 25 and includes the central portion 27a substantially contacting the blocking insulating layer 25.

The control gate electrode 27 may have a small width in the y-y' direction parallel to the bit line and a large length in an x-x' direction parallel to the word line. The control gate electrode 27 may simultaneously function as a word line and a control gate of each of the memory cells 10.

Bottom spacers 29 (e.g., mesa-type bottom spacers) may be formed in regions between the control gate electrodes 27 to fill regions between the edge portions 27b of the control gate electrodes 27 and the blocking insulating layer 25. The bottom spacers 29 may be formed of an insulating material. If the formation of the mesa-type bottom spacers 29 is followed by the formation of the control gate electrode 27, an inverted mesa-type control gate electrode 27, wherein the edge portion 27*b* (facing the blocking insulating layer 25) is inclined towards the blocking insulating layer 25, may be easily formed.

For example, mesa-type bottom spacers 29 (each having a wide bottom surface contacting the blocking insulating layer 25 and a narrow top surface) may be formed of an insulating material on the blocking insulating layer 25 except a region of the blocking insulating layer 25 corresponding to the central portion 27*a*. The control gate electrode 27 may be formed on the resultant structure having the bottom spacers 29. As such, the control gate electrode 27 may have an inverted mesa structure.

The shape of the bottom spacer 29 may be changed according to that of the control gate electrode 27. In order to form the control gate electrode 27 in a desired different shape, after the bottom spacer 29 is shaped in correlation with the desired shape of the control gate electrode 27, the control gate electrode 27 may be formed.

If the control gate electrode 27 is formed as described above, a gate dielectric material formed in the central portion of the memory cell 10 corresponding to the central portion 27*a* of the control gate electrode 27 that faces the blocking insulating layer 25 may have a different thickness from that formed in an edge portion of the memory cell 10 corresponding to the edge portion 27*b* of the control gate electrode 27 that faces the blocking insulating layer 25. The thickness of the gate dielectric material formed in the center portion of the memory cell 10 may correspond to the sum of thicknesses of the tunneling insulating layer 21, the charge storage layer 23 and the blocking insulating layer 25. The thickness of the gate dielectric material, formed in the edge of the memory cell 10, may correspond to the sum of thicknesses of the tunneling insulating layer 21, the charge storage layer 23, the blocking insulating layer 25 and a portion of the bottom spacer 29 interposed between the edge portion 27*b* of the control gate electrode 27 and the blocking insulating layer 25.

The gate dielectric material formed in the central portion of the memory cell 10 may be thinner than that formed in the edge portion thereof. The gate dielectric material formed in the edge portion of the memory cell 10 may be thicker outward (or towards an edge of the device).

If a set voltage is applied to the control gate electrode 27 during a program (or erase) operation of the memory cell 10, the amount of charges injected into the central portion of the memory cell 10 may differ from that of charges injected into the edge portion of the memory cell 10. In this case, electrons are injected into the memory cell 10 during the program operation, and holes are injected during the erase operation.

In particular, a higher electric field may be induced between the channel region 11*a* and the control gate electrode 27 in the central portion of the memory cell 10 on which the thinnest gate dielectric material is formed in order that charges are easily injected into the charge storage layer 23. In contrast, because the gate dielectric material formed the edge portion of the memory cell 10 is thicker than that formed in the central portion thereof and has a thickness that increases towards an edge of the device, a lower electric field may be induced in the edge portion of the memory cell 10 than in the central portion thereof between the channel region 11*a* and the control gate electrode 27 such that fewer charges are injected to the edge portion of the memory cell 10.

Figure 9:
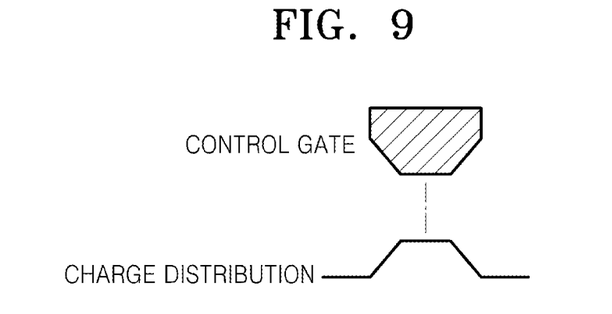
FIG. 9 is a schematic diagram of density distribution of charges injected into a charge storage layer if a control gate electrode is an inverted mesa structure as in a memory device according to example embodiments.
Figure 10:
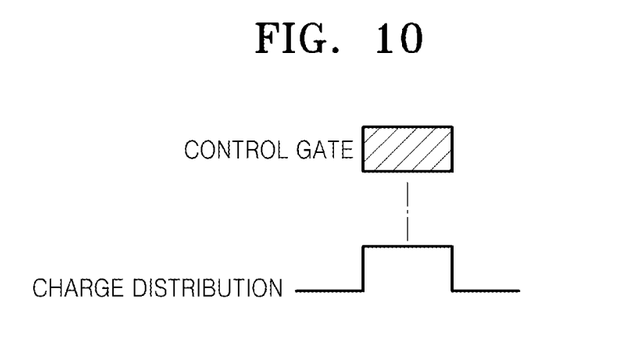
FIG. 10 is a schematic diagram of density distribution of charges injected into a charge storage layer if a control gate electrode has a constant thickness according to a comparative example.

FIG. 9 is a schematic diagram of density distribution of charges injected into a charge storage layer if a control gate electrode is an inverted mesa structure as in a memory device according to example embodiments. FIG. 10 is a schematic diagram of density distribution of charges injected into a charge storage layer if a control gate electrode has a constant thickness according to a comparative example.

As in the memory device according to example embodiments, if a control gate electrode has an inverted mesa structure, a gate dielectric material formed between a substrate and the control gate electrode is thinnest in a central portion and is thicker towards an edge portion. The largest amount of charges are injected into the central portion, and the amount of charged injected may gradually decrease toward the edge portion. As such, as shown in FIG. 9, the charge density of a region corresponding to the central portion 27*a* of the control gate electrode 27 is high, and the charge density of a region corresponding to the edge portion 27*b* of the control gate electrode 27 is lower. As such, charge density distribution may slightly vary at the boundary of the memory cell 10.

Referring to FIG. 10 (which shows a comparative example), if a control gate electrode has a constant thickness, charges are injected into a charge storage layer at uniform density so that charge density distribution sharply (or substantially) varies at a boundary of memory cell.

As shown in FIG. 4B, the charge density function of a charge storage layer of a memory cell slightly varies from a boundary of a memory cell toward the center of the memory cell. As described with reference to Equations 1-6, not only an E field of the charge storage layer but also an external field generated due to charges of an adjacent memory cell are further reduced at the boundary of the memory cell during data retention so that lateral movement of charges may be inhibited, reducing a variation in a program threshold voltage $V_{th}$.

In addition to the control gate electrode 27 with the inverted mesa structure, various control gate electrodes in which an edge portion is spaced farther from a blocking insulating layer than a central portion may be applied to memory devices according to example embodiments.

FIGS. 11 through 14 are schematic diagrams of various structures of a control gate electrode applicable to a memory device according to example embodiments.

In each of control gate electrodes 50, 60, 70, and 80 shown in FIGS. 11 through 14 according to example embodiments, an edge portion is spaced farther apart from a blocking insulating layer 25 than a central portion such that charges are more concentrated on a central portion of a memory cell than on an edge portion thereof and/or charge density distribution slightly varies at a boundary of memory cell.

Figure 11:
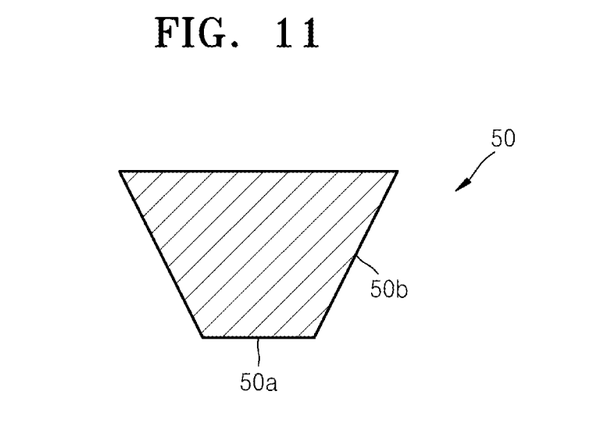
FIGS. 11 through 14 are schematic diagrams of various structures of a control gate electrode applicable to a memory device according to example embodiments.

Referring to FIG. 11, similar to the foregoing control gate electrode 27 with the inverted mesa structure, a central portion 50*a* of the control gate electrode 50 may have a plane surface disposed opposite the blocking insulating layer 25, while an edge portion 50*b* of the control gate electrode 50 may have an inclined surface to the blocking insulating layer 25. In this case, the edge portion 50*b* of the control gate electrode 50 may have a thickness equal to, or smaller than, that of the central portion 50*a* thereof and taper outward. Also, a bottom surface of the control gate electrode 50 that faces the blocking insulating layer 25 may be narrower than a top surface thereof. In other words, the control gate electrode 50 may have an inverted trapezoidal structure.

Figure 12:
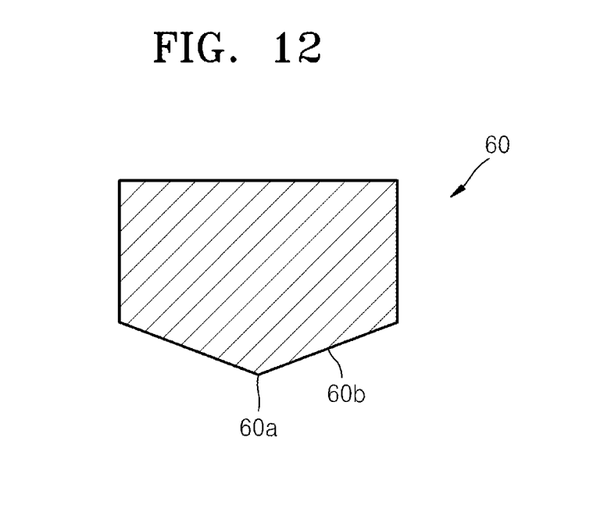

Referring to FIG. 12, a central portion of a surface of the control gate electrode 60 that faces the blocking insulating layer 25 may have a pointed inverted triangular sectional structure. An edge portion 60*b* of the control gate electrode 60 may be spaced farther from the blocking insulating layer 25 than a central portion 60*a* including a pointed portion.

Figure 13:
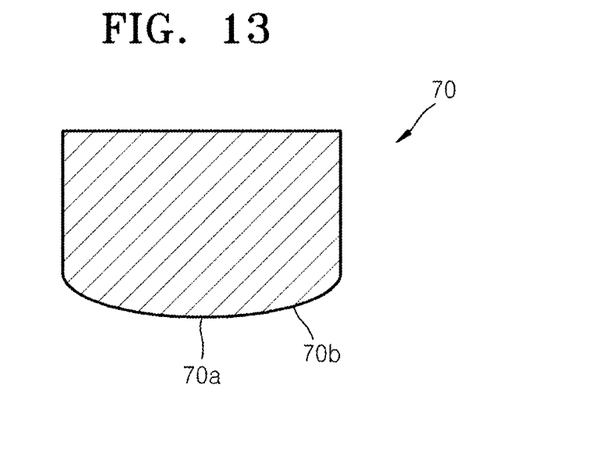

Referring to FIG. 13, a surface of the control gate electrode 70 that faces the blocking insulating layer 25 may have a convex surface that curves toward the blocking insulating layer 25. An edge portion 70b of the control gate electrode 70 may be spaced farther from the blocking insulating layer 25 than a central portion 70a including a portion of the convex surface that is closest to the blocking insulating layer 25.

Figure 14:
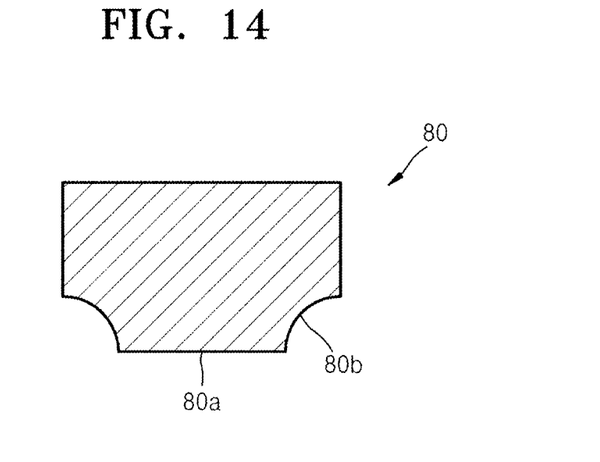

Referring to FIG. 14, a central portion 80a of the control gate electrode 80 may have a plane surface disposed opposite the blocking insulating layer 25, and an edge portion 80b of the control gate electrode 80 may have a concave surface that curves away and tapers outward from the blocking insulating layer 25.

In the various control gate electrodes 50, 60, 70, and 80 shown in FIGS. 11 through 14, if bottom spacers 29 are respectively formed to have structures corresponding to the control gate electrodes 50, 60, 70, and 80, a gate dielectric material formed in a central portion of a memory cell may be thinner than that formed in an edge portion of the memory cell and a gate dielectric material formed in the edge portion of the memory cell may be thicker towards an edge of the device.

The largest amount of charges may be injected into the central portion of the memory cell, and the amount of charges injected into the edge portion of the memory cell may decrease outward. Charge density may be high in a region corresponding to a central portion of a control gate electrode and gradually decrease outward in a region corresponding to an edge portion of the control gate electrode such that charge density distribution may slightly vary at a boundary of memory cell.

In a memory device according to example embodiments, lateral movement of charges due to electrostatic attraction between charges stored in a memory cell and charges stored in an adjacent memory cell may be inhibited (or reduced). As such, even if data is retained for a long time, degradation of reliability may be substantially reduced. A multi-level memory that stores at least two data in a single memory cell may be embodied with application of the memory device according to example embodiments. The memory device according to example embodiments may be applied to 64-Gbit or higher high-capacity NAND, or NOR nonvolatile memory devices (e.g., a high-capacity NAND or NOR CTF memory devices, which are highly-integrated memory devices with a cell size of about several tens nm).

Although a control gate electrode for a memory device according to example embodiments is described above with reference to FIGS. 7 and 8, it is not limited to the structure shown in FIGS. 7 and 8. The shape of the control gate electrode may be variously changed as long as charge density distribution is concentrated on a central portion of a memory cell and slightly varies at a boundary of memory cell. If a bottom spacer is further included, its shape may also be variously changed according to the shape of the control gate electrode.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A memory device, comprising:
a tunneling insulating layer on an active region;
a charge storage layer on the tunneling insulating layer;
a blocking insulating layer on the charge storage layer; and
a control gate electrode on the blocking insulating layer,
wherein the control gate electrode has an edge portion spaced farther apart from the blocking insulating layer than a central portion of the control gate electrode, and
wherein the control gate electrode has an inverted mesa structure having two opposing inclined surfaces each joined at one end to a bottom surface of the control gate electrode and at another end to a surface of the control gate electrode extending in a perpendicular direction to the bottom surface of the control gate electrode.

2. The device of claim 1, wherein the central portion of the control gate electrode has a plane surface opposite the blocking insulating layer, and
the edge portion of the control gate electrode includes one of the two opposing inclined surfaces, and
the two opposing inclined surfaces are each inclined towards the blocking insulating layer.

3. The device of claim 2, wherein the two opposing inclined surfaces are inclined towards the central portion of the control gate electrode.

4. The device of claim 2, wherein the edge portion of the control gate electrode has a thickness equal to, or smaller than, that of the central portion thereof, and
the edge portion of the control gate electrode tapers outward towards a sidewall of the memory device and away from the blocking insulating layer.

5. The device of claim 4, wherein the bottom surface of the control gate electrode, which faces the blocking insulating layer, is narrower than an opposite surface thereof.

6. The device of claim 1, further comprising:
at least two of the control gate electrodes; and
a bottom spacer between the at least two control gate electrodes, wherein the bottom spacer fills a region between the edge portion of the at least two control gate electrodes and the blocking insulating layer.

7. The device of claim 1, further comprising:
a gate dielectric material in the central portion of the memory cell corresponding to the central portion of the control gate electrode, wherein the gate dielectric material is thinner than that in an edge portion of the memory cell corresponding to the edge portion of the control gate electrode.

8. The device of claim 1, wherein the charge storage layer is a charge trap layer.

9. The device of claim 1, wherein the control gate electrode has another edge portion spaced farther apart from the blocking insulating layer than the central portion of the control gate electrode, and
the edge portions of the control gate electrode are on opposing sides of the control gate electrode and face the blocking insulating layer.

10. The device of claim 9, wherein the central portion of the control gate electrode is positioned between the edge portions of the control gate electrode.

* * * * *